United States Patent
Allen et al.

(10) Patent No.: US 8,916,089 B2
(45) Date of Patent: *Dec. 23, 2014

(54) METHOD AND APPARATUS RELATED TO NANOPARTICLE SYSTEMS

(75) Inventors: Mark Allen, Espoo (FI); Tomi Mattila, Espoo (FI); Ari Alastalo, Klaukkala (FI); Heikki Seppä, Helsinki (FI)

(73) Assignee: Valtion Teknillinen Tutkimuskeskus, Espoo (FI)

( * ) Notice: Subject to any disclaimer, the term of this patent is extended or adjusted under 35 U.S.C. 154(b) by 934 days.

This patent is subject to a terminal disclaimer.

(21) Appl. No.: 12/155,674

(22) Filed: Jun. 6, 2008

(65) Prior Publication Data
US 2009/0016924 A1   Jan. 15, 2009

(30) Foreign Application Priority Data
Jun. 8, 2007   (FI) .................................... 20075428

(51) Int. Cl.
*B22F 7/00*   (2006.01)

(52) U.S. Cl.
USPC ............................. 419/9; 264/434; 174/257

(58) Field of Classification Search
USPC ............................. 419/9; 264/434; 174/257
IPC .............................. B22F 2999/00; B82Y 30/00
See application file for complete search history.

(56) References Cited

U.S. PATENT DOCUMENTS

| | | | |
|---|---|---|---|
| 5,418,589 A | 5/1995 | Nakashima | |
| 7,482,198 B2 | 1/2009 | Bauer et al. | |
| 2004/0085797 A1* | 5/2004 | Mei et al. | 365/96 |
| 2004/0251581 A1* | 12/2004 | Jang et al. | 264/497 |
| 2006/0049486 A1* | 3/2006 | Chaudhari | 257/616 |
| 2009/0301769 A1* | 12/2009 | Seppa et al. | 174/257 |

FOREIGN PATENT DOCUMENTS

| | | |
|---|---|---|
| FI | 20060697 A | 1/2008 |
| WO | WO 97/13393 A1 | 4/1997 |
| WO | WO 2005/060008 A1 | 6/2005 |
| WO | WO 2005/104226 A2 | 11/2005 |
| WO | WO 2007/004033 A2 | 1/2007 |
| WO | WO 2007/038950 A1 | 4/2007 |
| WO | WO 2008/009779 A1 | 1/2008 |

OTHER PUBLICATIONS

Allen et al., "Electrical Sintering of Nanoparticle Structures", Nanotechnology, 2008, pp. 175201-175204 vol. 19, No. 17, IOP Publishing.

(Continued)

*Primary Examiner* — Weiping Zhu
(74) *Attorney, Agent, or Firm* — Birch, Stewart, Kolasch & Birch, LLP

(57) ABSTRACT

This publication discloses a method and apparatus for functionalizing nanoparticle systems. The method comprises treating a nanoparticle-containing layer so as to produce a pattern of structurally transformed zones, the treatment comprising applying an electric field through the nanoparticle layer. According to the invention an AC-field capacitively coupled to the nanoparticle-containing layer is used as said electric field. The treatment preferably results in at least partly sintered structures, which can be used as conductors, for example. The document discloses several realizations for utilization of the disclosed functionalization in mass-fabrication lines.

18 Claims, 7 Drawing Sheets

(56) References Cited

OTHER PUBLICATIONS

Figure 1A:
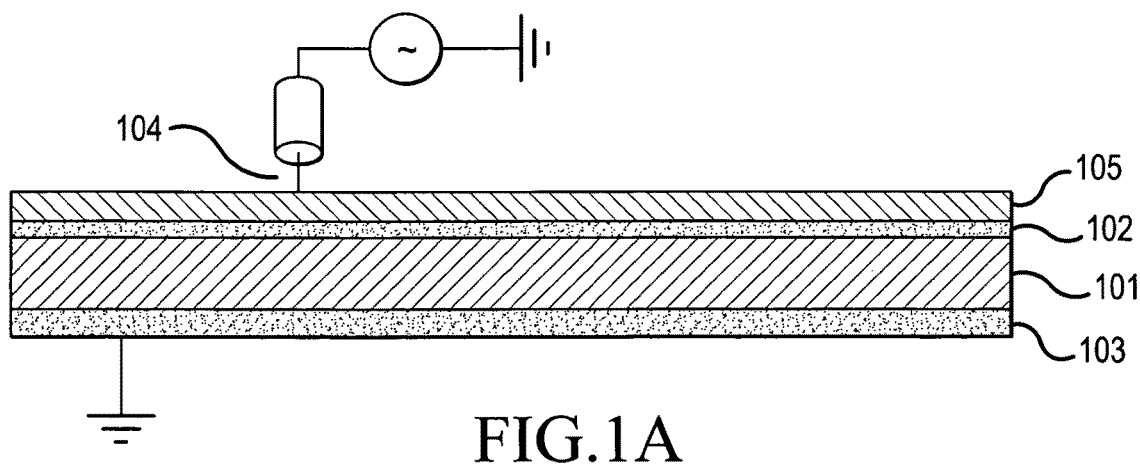

Bieri et al., "Manufacturing of Nanoscale Thickness Gold Lines by Laser Curing of a Discretely Deposited Nanoparticle Suspension", Superlattices and Microstructures, No. 3-6, 2004, vol. 35, 2004, pp. 437-444, Elsevier Ltd.

Sivaramakrishnan et al., "Controlled Insulator-to-Metal Transformation in Printable Polymer Composites with Nanometal Clusters", Nature Materials, Dec. 17, 2006, vol. 6, pp. 149-155, Nature Publishing Group, XP-002562813.

* cited by examiner

METHOD AND APPARATUS RELATED TO NANOPARTICLE SYSTEMS

FIELD OF THE INVENTION

The invention is related to electrically-induced structural transformations, such as electrical sintering, that are used to fabricate electrical devices and structures such as antennas and conductor structures. The invention is particularly advantageous in the field of printed electronics.

BACKGROUND OF THE INVENTION

Conductor structures can be created based on metallic nanoparticle suspensions printed on plastic or paper substrates and sintered by means of heat and optionally pressure at plastic/paper-compatible temperatures (T<200 C). Such silver nanoinks are readily available from companies such as Cabot or Harima.

The central disadvantages of the conventional thermal treatment include (i) the post-sintering is not area-selective i.e. the entire printed layers are sintered in the oven, (ii) the substrate may emit detrimental gases for the printed structure during thermal treatment of the entire structure and (iii) the durability of the substrate restricts the usable temperature range.

Patent Application FI 20060697, still unpublished when filing the present application, describes an improved method for sintering nanoparticle systems, electrical sintering. In that method, the nanoparticle system conductivity drastically improves under electrical treatment. In comparison with the conventional thermal sintering, the electrical sintering method is fast and reduces the thermal loading of the substrate and other surrounding structures. S. Sivaramakrishnan, et al., Controlled insulator-to-metal transformation in printable polymer composites with nanometal clusters, Nature Materials 6, 149 (2007) and Patent Application publication WO 2007/004033 describe another method for sintering nanoparticles using electric field.

US 2004/0085797 discloses a method for changing the state of nano- or microparticles by means of electric DC voltage. The voltage is applied by electrodes located on surfaces of a flexible, gel-like layer containing dispersed particles, whereby the particles orient aligned to the electric field or form clusters, the conductivity of the structure being locally increased. The method is not well suitable for producing non-volatile structures and cannot be used for forming conductor wires on surfaces.

WO 2005/104226 discloses a method for fabricating through-contacts in semiconductor chips by applying a very high (>1 kV) voltage burst through a nanoparticle-containing layer. The method cannot be used for forming conductor wires on surfaces.

Laser curing [See, e.g., Bieri et al., Superlattices and Microstructures 35,437 (2004)] is also a recognized method for sintering of metal nanoparticle assemblies. However, power transfer to the sintered material is a problem in sintering by optical wavelengths due to high reflectivity of metallic surface. The applicability of laser curing to thicker (t>>10 nm) layers and larger nanoparticles (d>>2 nm) remains questionable.

WO 2007/038950 discloses a method for fabricating metallic patterns on a substrate by coating the substrate with metal particles in the form of said pattern and heating the substrate by microwave radiation. The method does not allow selective patterning of nanoparticle layers.

WO 2005/060008 discloses a method for electrolytic treatment of nanoparticulate layers for the production of solar cells. In the method, a nanoparticulate layer on an electrode can be affected by resistively applying a current through the layer and an electrolytic solution the electrode is immersed in. The method necessitates the use of electrically conductive substrates, can not be carried out at ambient air, for example, and is not suited for selective patterning.

SUMMARY OF THE INVENTION

It is an object of the invention to provide an improved method for producing functional structures from nanoparticles in a controlled manner, that is providing the capability to selectively functionalize printed nanoparticle layers. In particular, it is an aim of the invention to achieve a fast method, which is at the same time suitable for mass production.

It is also an object of the invention to provide a novel apparatus for carrying out the present functionalization process and a novel use.

The abovementioned goals are reached by coupling a nanoparticle-containing layer with an AC field so as to structurally transform the nanoparticles.

Thus, in the method according to the invention geometrical patterns are produced out of a nanoparticle-containing layer. According to the invention the nanoparticle-containing layer is coupled with an alternating electric field in order to initiate nanoparticle transformation, so as to form structurally transformed patterns. The coupling is capacitive by nature, in contrast to known radiative and resistive sintering processes.

The apparatus according to the invention comprises means for applying through a nanoparticle layer an AC-field in order to structurally transform the layer into zones by means of an electric field applied through the nanoparticle layer.

The formed structures may have altered electrical, mechanical or optical properties, for example. In particular, the structure may have increased electrical conductivity.

According to a preferred embodiment, the present invention is used for converting layers containing dispersed nanoparticles into a geometrical pattern of at least partially sintered nanoparticles, by using an alternating electric field strong enough to at least partially sinter or fully melt said nanoparticles. Preferably metallic nanoparticles typically having a polymeric encapsulation are used for producing at least partly sintered conductor structures. However, it is to be noted that nanoparticle layers can also be functionalized by means of the present invention without any level of actual sintering. For example, when ceramic nanoparticles encapsulated with ligand giving large interparticle spacing are subjected to the present method, the ligand can contract under the effect of the strong, alternating electric field. This can significantly alter the electrical properties of the ceramic nanoparticle layer.

More specifically, the present method and apparatus are characterized by what is stated in the independent claims.

Advantageous embodiments of the invention are characterized in the dependent claims. Embodiments of the method comprise alone or as a suitable combination using a local electric field whose shape corresponds to the desired structurally transformed pattern, using an electric field strong enough to sinter or fully coalesce said nanoparticles, applying the electric field substantially perpendicular or parallel to the plane of the nanoparticle-containing layer, applying the electric field using electrode means, such as a plane or roll stamper, comprising a patterning electrode the shape of which corresponds to said geometrical pattern, applying the electric field using a roll-to-roll method in which a substrate comprising said nanoparticle layer is transferred through a nip formed by said rolls, the electric field being localized in said nip, applying the electric field with two opposing electrode means, such as rolls, placed on different sides of the nanoparticle-containing layer, one of the electrode means being provided with an array of electrode subunits, whose electric potential is individually controllable for producing the desired geometrical pattern, and the other of the electrode means serving as a counter-electrode so as to apply a field perpendicular to the nanoparticle-containing layer.

applying the electric field with an electrode member, such as roll, comprising an array of electrode subunits whose electric potential is individually controllable for producing the desired geometrical pattern, and a counter-electrode surrounding the subunits so as to apply a lateral electric field through the nanoparticle-containing layer, applying the electric field by means of a probe-like electrode, which is moved with respect to and in the vicinity of the nanoparticle layer in order to form said geometrical pattern, using several probe-like electrode widths for producing structurally transformed lines having different line widths, using a geometrical pattern that forms an electrical interconnection between a contact terminal of a an electrical component, such as a microchip, and the structurally transformed nanoparticle-containing layer, simultaneously to applying said electric field with electric field applying means, monitoring the AC-impedance seen by the electric field applying means, stopping the transformation process when a desired level of impedance, in particular resistive portion thereof, is reached, removing nanoparticle material from areas structurally not transformed, applying the nanoparticle-containing layer on a substrate by means of a material dispenser tool, such as inkjet head, gravure roll, flexographic tool or electrophotographic tool, using a nanoparticle-containing layer that is, prior to applying the electric field, localized on the substrate to areas corresponding to said geometrical pattern, treating the dispensed is treated prior to applying the electric field by means of radiation, for example, by IR, visible or UV light.

using as said nanoparticles conductive metallic nanoparticles, using as said nanoparticles semiconductive nanoparticles, using as said nanoparticles insulating nanoparticles, using as said nanoparticles encapsulated nanoparticles, preferably coated with polymer, forming a closed-loop structure, using an AC-frequency of at least 1 kHz, preferably 100 MHz-5 GHz, in particular 100-500 MHz.

using a nanoparticle layer is situated on a paper, board or plastic substrate, using a nanoparticle layer that is sandwiched between two insulating layers.

Embodiments of the present apparatus comprise alone or as a suitable combination means for applying the electric field to the nanoparticle-containing layer substantially perpendicular or parallel to the plane of the nanoparticle-containing layer, a probe-like electrode, which is movable in the vicinity of said nanoparticle layer with respect to the nanoparticle layer, substrate-receiving means, the apparatus being capable of moving a substrate placed to said substrate-receiving means and containing said nanoparticle-containing and the probe-like electrode with respect to each other so as to define the formed pattern by means of said movement, a plane or roll stamper comprising an electrode the shape of which corresponds to said geometrical pattern, two electrode rolls, which form a nip for localizing said electric field and the apparatus further comprises means for feeding a substrate containing said nanoparticle layer through the nip for initiating said structural transformation, a roll comprising a conductive electrode pattern, whose shape corresponds to the shape of said geometrical pattern and which is coated with an insulating material layer, means for forming closed-loop patterns, such as an electrode shapes so as to form a closed loop, two opposing electrode means, such as rolls, placed on different sides of the nanoparticle-containing layer, one of the electrode means being provided with an array of electrode subunits, whose electric potential is individually controllable for producing the desired geometrical pattern, and the other of the electrode means serving as a counter-electrode for applying a field perpendicular to the nanoparticle-containing layer, an electrode member, such as roll, comprising an array of electrode subunits whose electric potential is individually controllable for producing the desired geometrical pattern, and a counter-electrode surrounding the subunits for applying a lateral electric field through the nanoparticle-containing layer, visualization tools, preferably working in the IR or visible light range, for monitoring the transformation process.

The invention and its embodiments offer significant benefits. In particular, capacitive coupling according to the invention provides a method for effectively and selectively functionalizing printed nanoparticle layers in the form of a desired pattern through a non-contact process. This is because AC-fields have been found to couple to nanoparticle-containing layer sufficiently for enabling structural transformations in the layer take place, provided that, the frequency of the applied AC-voltage is selected such that the interaction delivers enough power to the nanostructure. The voltage and frequency depend on the type of the nanomaterial and electrical properties of its surrounding layer structure, as they have an effect on the capacitive load of the system.

The invention also enables utilization of electrical functionalization in mass-fabrication lines, for example, in order to produce sintered or fully coalesced conductor structures. This has substantial advantages because the AC-transformation process i) is fast (the sintering phase takes less than a second), ii) reduces the thermal loading of the substrate because heat is concentrated only to the part being sintered and not to the whole structure, iii) enables direct online monitoring of the conductivity of the sintered line and iv) enables patterning of the conductor structure during sintering, for example, by computer-controlled equipment. By means of the present method, long curing times of thermal sintering can be avoided in mass-production lines.

Compared with known DC-sintering methods, the present invention offers a possibility to fabricate diverse electric structures for electric modules using printable nanoparticles. The shape of the structures is not limited to one dimension only, as in the present methods because of their abrupt nature, but is particularly suitable for producing two-dimensional (curved, closed-loop etc.) structures in a very controlled way.

Roll-to-roll/ink-jet printing methods can alone produce patterns with feature sizes >50 um. Using the invented method, the patterning resolution can be as low as a few micrometers.

The invention also allows the manufacturing of closed-loop structures in a convenient way. This has not been possible by the known electrical sintering methods in the case of nanoparticle-containing layers which have not been pre-patterned, due to the lack of well-controllable selectivity of the sintering phase.

Another benefit of the invention with respect to thermal sintering is the reduced thermal loading of the substrate. Thus, substrates not withstanding temperatures over 200 degrees C. (e.g. paper, board, many plastics) can be used. Preferably, the method is carried out at room temperature.

An application of this method is the patterning of conductive wiring on a paper, board or plastic substrate covered with a layer of metallic nanoparticles. The known method of laser curing can also be applied for pattering conductive structures, but transferring this patterning method to a high volume continuous (e.g. roll-to-roll) process is challenging. The method described in this invention can be easily applied also in the roll-to-roll printing environment.

The electric field is preferably applied by means of programmable voltage electrodes. A probe-like electrode, which is moved (motion-programming) with respect to a nanoparticle layer in order to form the geometrical pattern. The method corresponds to "pencil-like writing" to the substrate. Alternatively, the electric field is applied by means of a roll stamper (printing cylinder) comprising an electrode the shape of which corresponds to the geometrical pattern (electrode shape-programming). A further possibility is to apply the electric field by means of a roll that is not patterned according to the geometrical shape but the electrical sintering roll is only used for sintering and patterning is done by other means, such as printing. Because of the AC-field used, the sintering roll can be coated with an insulating material layer.

The material being sintered (i.e., forming the final static structure) can be electrically conductive, semiconductive or insulating in nanoparticular form. Typically encapsulated nanoparticles, preferably coated with polymer, are used.

Preferably, a high AC-frequency is used for initiating the structural transformation. By "high frequency" is meant frequencies of at least 1 MHz, typically 100-500 MHz or even higher, even frequencies in the GHz-range.

Preferably, the nanoparticle layer is situated on an insulating or lossy substrate, preferably a paper, board or plastic sheet. The nanoparticle layer can be sandwiched between two insulating or electrically lossy layers, thus allowing it to be mechanically safeguarded.

Other optional features and benefits of the invention and its embodiments become clear from the detailed description below.

By the term "capacitive coupling" we mean also such implementations where the AC-field is coupled to the nanoparticle layer resistively from one side (e.g., if a nanoparticle layer is printed directly on a conductive substrate serving as one electrode) and in the functionalization, the other electrode is at a distance from the nanoparticle layer. Thus, the term includes all such couplings where there is dielectric material through which the AC-field penetrates between the nanoparticle layer and at least one of the electrodes. The invention is not limited to any particular excitation method of the AC-field.

SHORT DESCRIPTION OF THE DRAWINGS

Figure 1B:
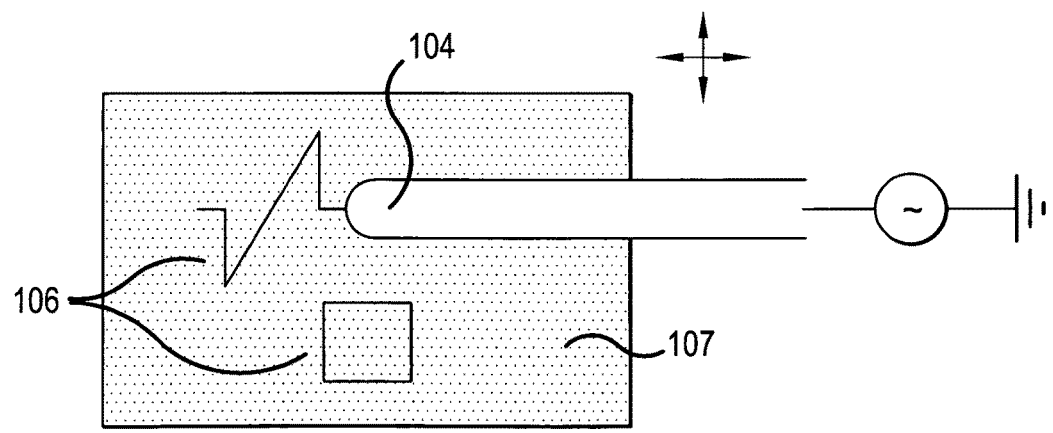
Figure 2:
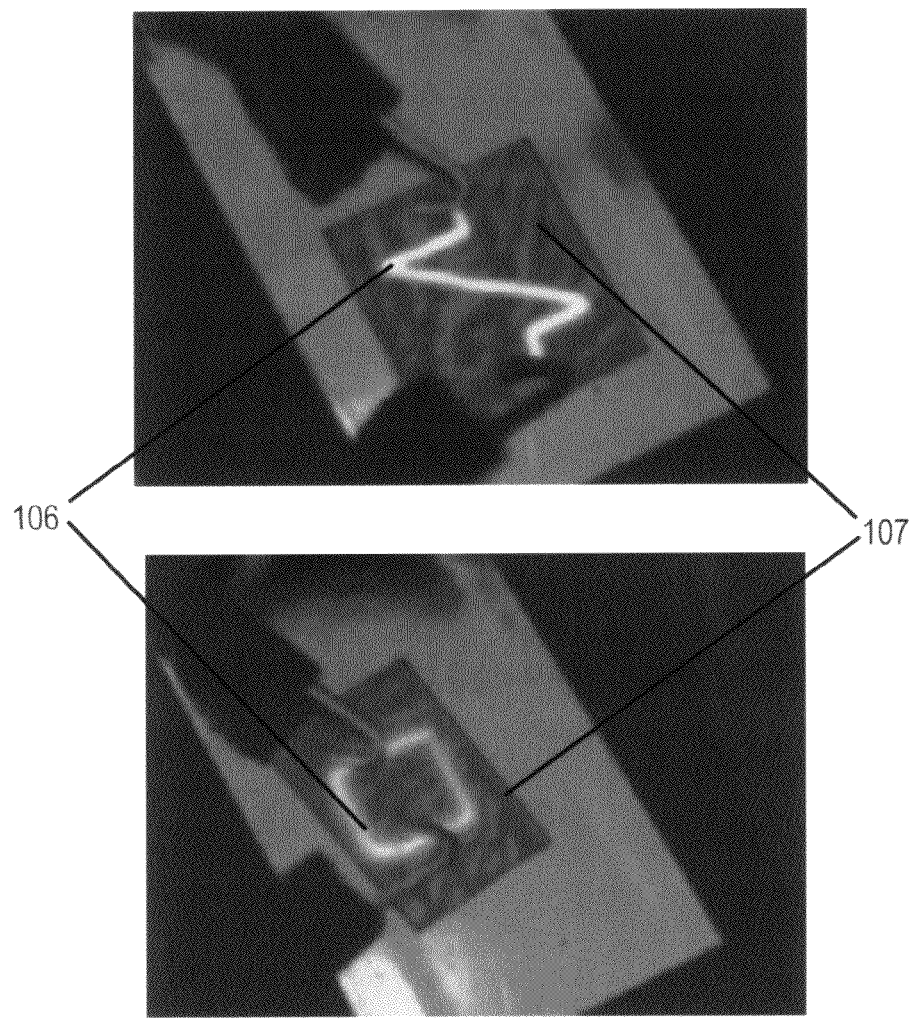
Figure 3:
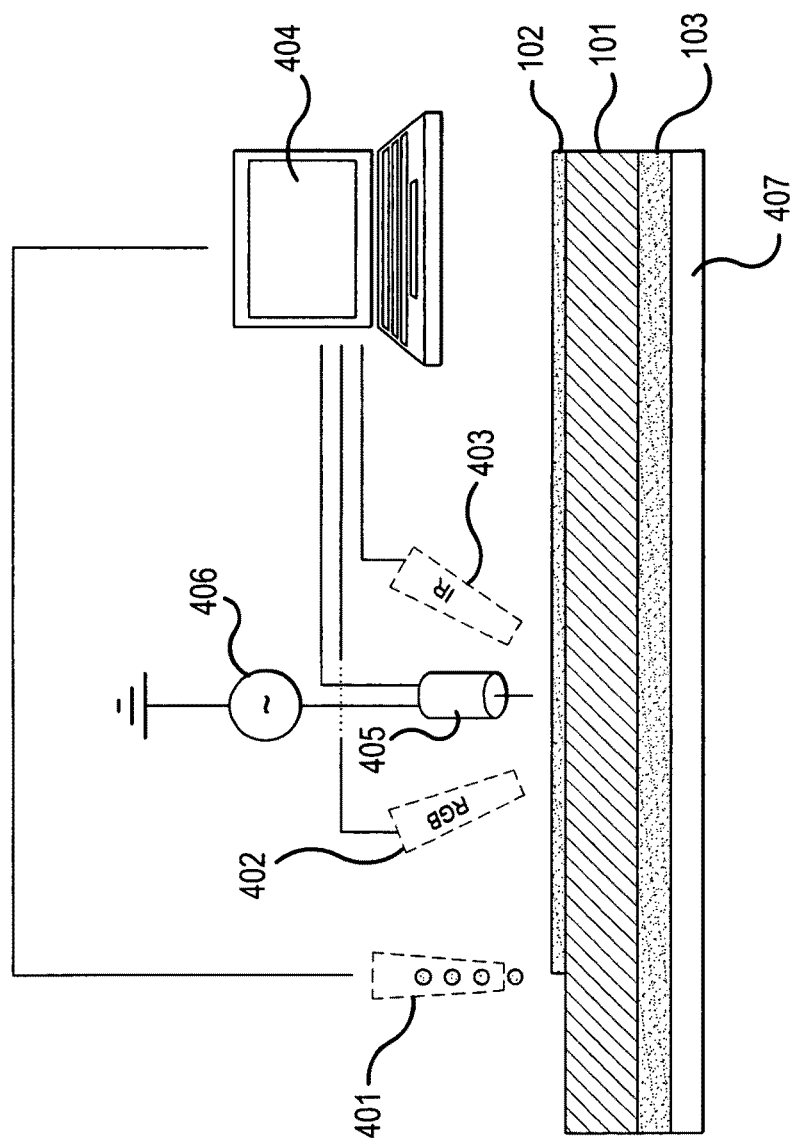
Figure 4:
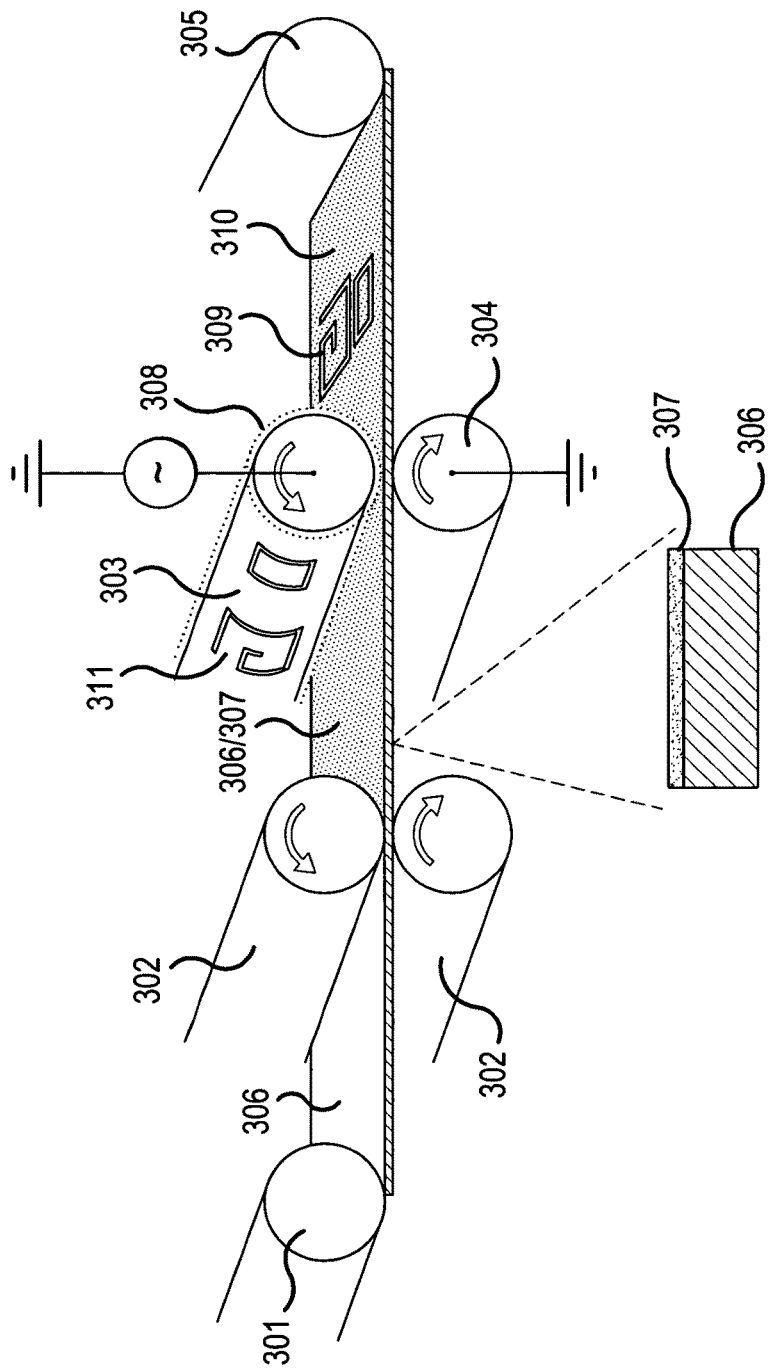
Figure 5:
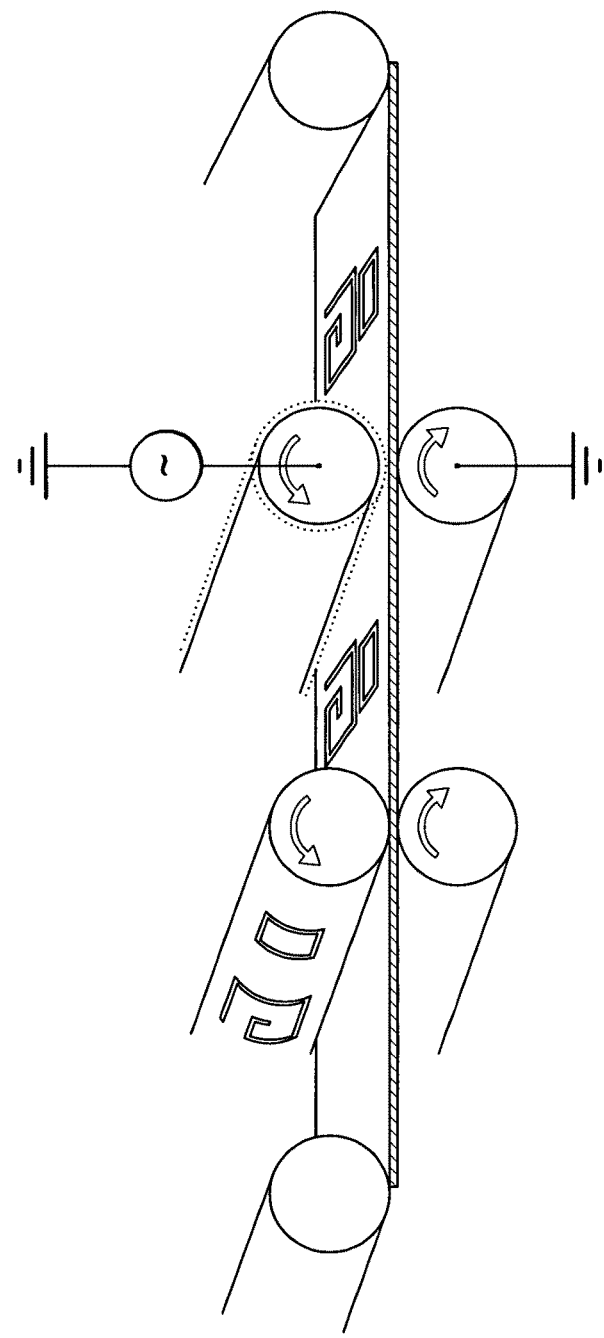
Figure 6A:
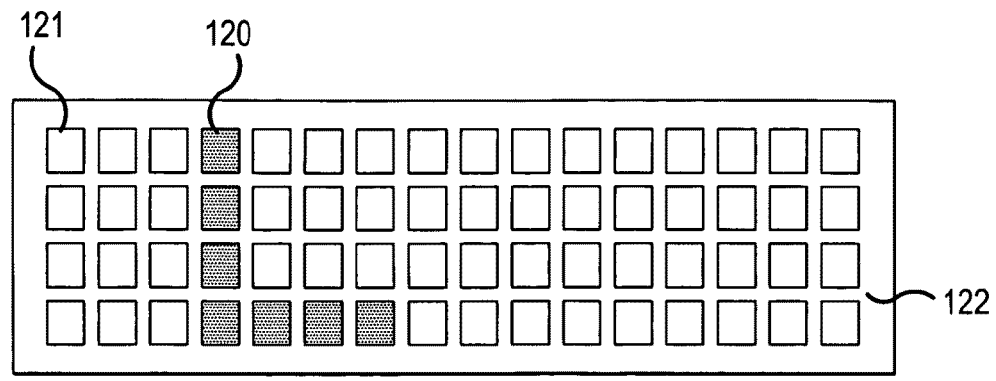
Figure 6B:
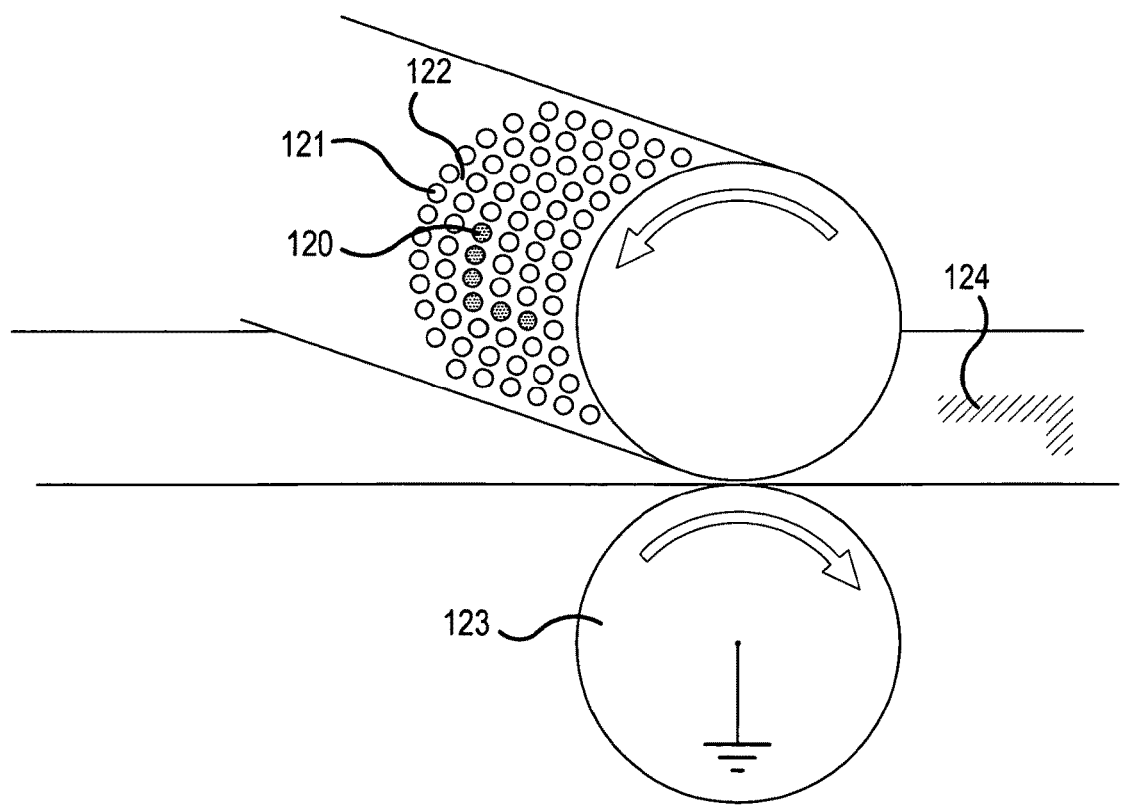
Figure 7A:
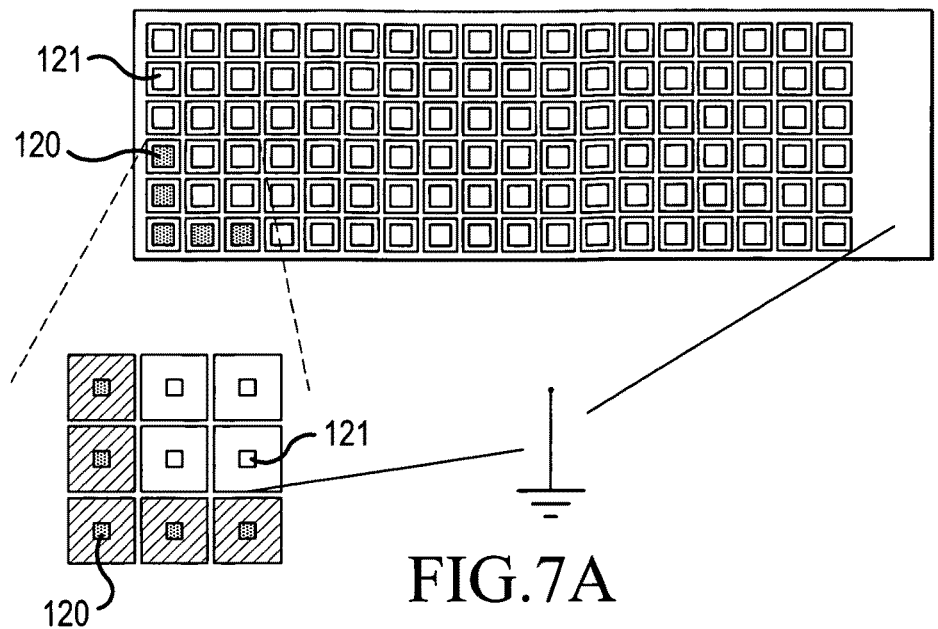
Figure 7B:
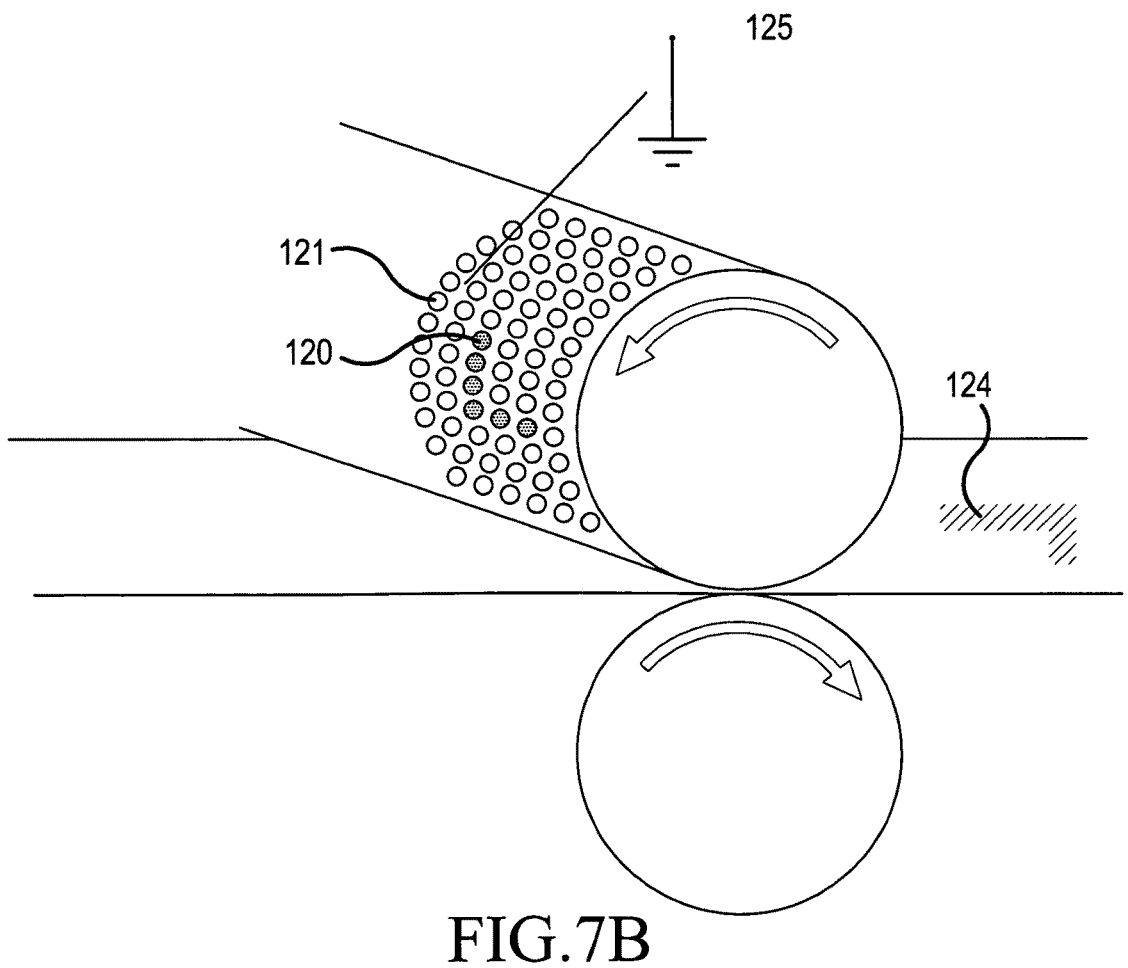

Some advantageous embodiments of the invention are described in more detail referring to the appended drawings, in which FIG. 1A shows a side view of a probe-like write-head that moves on top of a substrate, FIG. 1B shows a top view of the probe-like write-head of FIG. 1a that moves on top of a substrate, FIG. 2 illustrates examples of structures created utilizing the invented method and apparatuses, FIG. 3 shows one embodiment of a computer-controlled sintering setup, FIG. 4 depicts a roll-to-roll realization with electrical patterning and sintering, FIG. 5 depicts a roll-to-roll realization with electrical sintering, FIG. 6A illustrates pixel topology for vertical roll-to-roll sintering, FIG. 6B illustrates an apparatus for carrying out vertical roll-to-roll sintering, FIG. 7A illustrates pixel topology for lateral roll-to-roll sintering, and FIG. 7B illustrates an apparatus for carrying out lateral roll-to-roll sintering.

DETAILED DESCRIPTION OF THE EMBODIMENTS

The invention provides a method to functionalize a nanoparticle layer in a desired pattern using an AC-electric field. This functionalization can comprise either insignificant, partial, or full sintering of nanoparticles to form conductor patterns. Preferably, metallic nanoparticles are used, but AC sintering can be applied even if the material does not have metallic properties, i.e., is not DC-conductive. Thus, also semiconductive or dielectric materials can be functionalized. Also large gaps are tolerable between the sintering device and the material since capacitive coupling is utilized.

Suitable metals are particularly silver, gold, copper, platinum, nickel, palladium, iron, titanium, tin, and alloys of these. In the case of semiconductors, reference can be made particularly to silicon, germanium, titanium, zinc, GaAs, and indium-based semiconductors. Oxide semiconductors can also be used, especially titanium dioxide and zinc oxide. Ceramic nanoparticles may be used in connection with the invention, too.

As shortly referred to above, functionalization in this context has three main realizations. Functionalization with insignificant degree of sintering can take place if the nanoparticles (optionally apart from their encapsulation layers) reside sufficiently far from each other not to mechanically contact each other but having the property of deforming under the strong AC-field applied in a way that affects the electrical properties of the layer. Functionalization with partial sintering means an event resulting in the partial coalescence of neighboring nanoparticles. Functionalization by full sintering (or melting) is meant the production of such structures, where the individual nanoparticles used for forming the layer are no more distinguishable in the end of the process, the layer typically forming an essentially uniform layer (full coalescence). All three realizations are industrially applicable and valuable and have their specific advantages with respect to the process and end products. Common to all realizations is, that they can be implemented by means of a capacitively coupled AC field applied over the nanoparticle layer. However, the term "functionalization" should be understood broadly, and it may include also the nanoparticle material dispensing stage, as in some embodiments the dispensing and patterning are closely related actions and have an influence on the functionality of the resulting structure.

The term "sintering" is frequently used when describing the embodiments of the invention. It is to be noted that depending on the type and density of the nanoparticles, and the electrical setup used, full or partial sintering or functionalization by other means is possible with the embodiments.

FIGS. 1A and 1B depict one preferred embodiment of the invention. Here, the invention is applied in a probe-like manner where the nanoparticle layer functionalization occurs as the AC-probe is moved with respect to the nanoparticle layer. Either the probe or the printing surface carrying the nanoparticle layer can do the movement. Here, the substrate 101 with a nanoparticle layer 102 on its surface is placed over the ground plane 103. The probe 104 is brought close to the nanoparticle layer with the intention of maximizing the electric flux density passing through the nanoparticle layer in the near vicinity of the probe. Optionally, an insulator film 105 can be placed between the probe and the nanoparticle layer. The AC current passes capacitively through the insulating layer.

The optional insulating film 105 allows a convenient mechanical contact between the probe and the structure to be functionalized. The advantages include a well-controlled capacitive coupling set by the insulating film thickness. This is advantageous e.g. in the case of uneven surface profile which otherwise would require a vertical probe position control mechanism to prevent a direct contact between the probe and the nanoparticle layer (electrical shorts, scratching of the nanoparticle layer, varying capacitive coupling).

The AC-probe can be moved across the nanoparticle layer so as to create a desired pattern, functionalizing the patterned part of the layer 106 while leaving the rest of the layer non-functionalized 107. Optionally, following the patterning, removal of the non-sintered material can be applied.

As one preferred application, the invention can be utilized for creating (via sintering) electrical conductors in a layer of non-sintered metallic nanoparticles. FIG. 2 shows IR images of a pulse and a square shaped conductors 106, patterned using the invented method in a non-sintered silver nanoparticle layer 107 deposited on a paper substrate. The patterning was realized using an AC-probe at 300 MHz frequency. After patterning, the conductor was illustrated for demonstration purposes by a DC current causing the conducting parts of the nanoparticle layer to heat such that they become visible at infrared frequencies (the images in FIG. 2 are taken using a IR-camera with peak sensitivity around 10 um wavelength).

One of the advantages of this embodiment is that the line width is essentially determined by the width of the probe-needle. Another advantage is suitability of the method in making interconnections between previously fabricated electric structures. A further advantage is the possibility to create closed-loop structures as depicted in FIG. 2.

FIG. 3 shows a preferred probe-sintering setup with material dispenser 401, such as inkjet head, and instruments 402 and 403 the number of which can be any. The instruments can be, for example, cameras with suitable optical magnification for visualization (for example, at IR or visible light) or light/laser sources (IR, visible or UV) for heat treatment in order to dry off the ink solvent. The AC-probe 405 and the related electrical power source 406 are used for electrical functionalization of the deposited structures. The entire setup is computer controlled 404. In the setup, the printing stage 407 as well as the printing, functionalization and visualization equipment 401-406 can include position mechanisms (e.g. xyz-positioners).

In all field-applying embodiment disclosed above and hereinafter, any material dispensers known in the field and suiting for nanoparticle application can be used. Preferred instruments, however, include inkjet heads, gravure rolls, flexographic rolls or electrophotographic tools. Of special importance in mass-production are methods, where in both the material-dispensing and the field-applying stages roll-to-roll methods. By means of the embodiments of invention, a novel and efficient production line for, for example, printed electronics circuits, can be realized.

The electric field can be applied using a rolls or the like, preferably such that the substrate comprising the previously applied nanoparticle layer is transferred through a nip formed by two rolls. Thus, the electric field is localized in said nip, the field direction being perpendicular (field from one roll to another) or in the plane (field "within" a roll) of the substrate.

FIG. 4 shows another preferred roll-to-roll embodiment of the invention. Here the printing substrate 306 moves from the first roll 301 through the processing stages 302 and 303/304 onto the final roll 305. The first processing stage 302 is used to coat the substrate 306 with a nanoparticle layer 307. For example, a nanoparticle ink or dispersion can be used in the first processing stage. Alternatively to the rolls 302 shown in FIG. 4, the first processing stage can comprise an ink-jet head or other means for nanoparticle deposition. Between the processing stages 302 and 303/304 the liquid solvent of the nanoparticle coating (such as ink or dispersion) sufficiently dries off to leave a non-sintered nanoparticle layer. A heating stage (e.g., thermal or IR oven) can be used between the stages 302 and 303/304 to enhance the drying. The second processing stage 303/304 is the roll-to-roll sintering/patterning stage. In this stage, the lower roll 304 or at least its surface is electrically conducting and grounded. AC current is fed to the top roll 303 of the sintering stage which is structured so that the current essentially passes through the patterning structures 311 on the surface of the sintering roll 303. For example, the roll 303 can be made of a single conducting material shaping its surface such that the patterning structures 311 appear as protrusions at the roll surface. Other than the patterning parts 311 of the surface of the roll 303 can also be coated with an insulating material to further emphasize the electrical contacts through the patterning structures 311. Alternatively, the sintering roll can be covered by a thin dielectric layer 308 as in the case of FIG. 1. Furthermore, the production line can include the option that the thin dielectric layer is deposited or laminated on top of the layer to be electrically functionalized. After going through the sintering stage 303/304, the surface of the printing substrate contains both sintered 309 and non-sintered 310 material regions. If needed, a processing stage can be added after the sintering stage 303/304 that removes the non-sintered material.

Some parts of FIGS. 1 and 4 have similar roles:
Ground plane or roll: 103 ↔ 304
Substrate: 101 ↔ 306
Nanoparticle layer: 102 ↔ 307
Dielectric layer: 105 ↔ 308
Sintered structure: 106 ↔ 309
Non-sintered structure: 107 ↔ 310

Another preferred roll-to-roll embodiment of the invention, shown in FIG. 5, differs from that of FIG. 4 such that the patterning is done in the first processing stage and only the sintering in the second processing stage. Here the first processing stage can be, for example, normal roll-to-roll gravure stage. The sintering of the second processing stage can now be done with an electrically conductive roll having a non-patterned surface. A central benefit of this embodiment with respect to that of FIG. 4 is that removal of non-sintered material is not needed.

The sintering power can be adjusted so that complete sintering is not the only option. For example, a series resistor can be utilized to set the resistivity level of the final conductor structure.

The electric field can be applied through the nanoparticle layer perpendicular or parallel to the plane of the layer. Below is described preferred embodiments for online-programmable functionalization method, i.e., methods utilizing patterning tools that can be conveniently adjusted using a computers, for example.

FIGS. 6 and 7 describe two possible methods of utilizing online-programmed roll-to-roll functionalization. In the method shown in FIG. 6, pixels 120,121 (small metallic plates on the roll each having its own electrical feed-line) are separated only by a very thin insulator 122 preventing the separate pixels from being short-circuited. By controlling to which pixels 120 the AC-voltage is fed the others 121 being held at ground potential, a pattern 124 determined by the active pixels 120 will be functionalized on the nanoparticle layer as the substrate passes between the roll with active pixels and the ground roll 123. By programming adjacent pixels to be active, continuous functionalized traces 124 (e.g. electrically conductive wiring) are obtained in the nanoparticle layer.

Generally speaking, the method of FIG. 6 is an example of using a programmable, perpendicular-to-the-substrate field using two electrode means placed on different sides of the nanoparticle-containing layer, one of the electrode means being provided with an array of electrode subunits, whose electric potential is individually controllable for producing the desired geometrical pattern, and the other of the electrode means serving as a counter-electrode.

In the method shown in FIG. 7, the individual pixels 120, 121 are now formed by very small pads (or probe needle ends) surrounded by a grid of wiring 125 held at ground potential. In this case the electric field is not directed between each pixel and a separate ground cylinder, but rather in the lateral direction between the small central pad and the grounding around the pad. This way the electric field is not required to pass through both the nanoparticle layer and the substrate. By controlling which pixels are active (each of the pixels has its own electrical feed-line) the others 121 being held at ground potential, a pattern 124 determined by the active pixels 120 will be functionalized on the nanoparticle layer as the substrate comes into contact with the cylinder. By programming adjacent pixels to be active, continuous functionalized traces 124 (e.g. electrically conductive wiring) are obtained in the nanoparticle layer.

FIG. 7 thus represents a method and apparatus of applying the electric field parallel (lateral) to the substrate with an electrode member, comprising an array of electrode subunits whose electric potential is individually controllable for producing the desired geometrical pattern and a counter-electrode surrounding the subunits.

Instead of a roll-to-roll method, also programmable or non-programmable planar application tools, such as electrode plates and the like field applicators can be utilized. However, roll-to-roll methods provide for increased level of speed for mass production purposes.

The invention claimed is:

1. A method for functionalization of nanoparticle systems, comprising treating a nanoparticle-containing layer so as to produce a pattern of structurally transformed zones, the treatment comprising applying an electric AC-field through the nanoparticle-containing layer to capacitively couple with the nanoparticle-containing layer in a non-contact process to effect selective functionalization of said nanoparticle-containing layer by structurally transforming nanoparticles according to said pattern, said method using an electric field strong enough to sinter or fully coalesce said nanoparticles.

2. A method according to claim 1, wherein said applying step applies the electric field substantially perpendicular or parallel to the plane of the nanoparticle-containing layer.

3. A method according to claim 1, wherein said applying step applies the electric field using an electrode unit comprising a patterning electrode the shape of which corresponds to said geometrical pattern of structurally transformed zones.

4. A method according to claim 3, wherein said electrode unit is a plane or roll stamper.

5. A method according to claim 1, wherein the electric field is applied using a roll-to-roll method in which a substrate comprising said nanoparticle layer is transferred through a nip formed by rolls, the electric field being localized in said nip.

6. A method according to claim 1, wherein the electric field is applied with two opposing electrode units placed on different sides of the nanoparticle-containing layer, one of the electrode units being provided with an array of electrode subunits, whose electric potential is individually controllable for producing the desired geometrical pattern of structurally transformed zones, and the other of the electrode units serving as a counter-electrode so as to apply a field perpendicular to the nanoparticle-containing layer.

7. A method according to claim 6, wherein the electrode units are rolls.

8. A method according to claim 1, wherein the electric field is applied with an electrode member comprising an array of electrode subunits whose electric potential is individually controllable for producing the desired geometrical pattern of structurally transformed zones, and a counter-electrode surrounding the subunits so as to apply a lateral electric field through the nanoparticle-containing layer.

9. A method according to claim 8, wherein the electrode member is a roll.

10. A method according to any of claim 1, wherein the electric field is applied with a probe-like electrode, which is moved with respect to and in the vicinity of the nanoparticle layer in order to form said geometrical pattern of structurally transformed zones.

11. A method according to claim 1, the method further comprising, simultaneously to applying said electric field with an electric field applying unit, monitoring the AC-impedance seen by the electric field applying unit.

12. A method according to claim 11, the method further comprising stopping the transformation process when a desired level of impedance is reached.

13. A method according to claim 12, wherein said level of impedance is a resistive portion thereof.

14. A method according to claim 1, wherein said nanoparticles are encapsulated metallic or semiconductive nanoparticles.

15. A method according to claim 14, wherein said encapsulated metallic or semiconductive nanoparticles are coated with polymer.

16. A method according to claim 1, wherein said geometrical pattern of structurally transformed zones comprises a closed-loop structure.

17. A method according to claim 1, wherein said nanoparticle layer is situated on a paper, board or plastic substrate.

18. A method according to claim 1, said method using a local electric field whose shape corresponds to the desired structurally transformed pattern.

\* \* \* \* \*